United States Patent
Steeneken et al.

(10) Patent No.: US 8,183,946 B2
(45) Date of Patent: May 22, 2012

(54) CHARGE BIASED MEM RESONATOR

(75) Inventors: Peter Steeneken, Valkenswaard (NL); Jozef Thomas Martinus Van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 911 days.

(21) Appl. No.: 11/722,634

(22) PCT Filed: Dec. 21, 2005

(86) PCT No.: PCT/IB2005/054361
§ 371 (c)(1),
(2), (4) Date: Sep. 23, 2008

(87) PCT Pub. No.: WO2006/067757
PCT Pub. Date: Jun. 29, 2006

(65) Prior Publication Data
US 2009/0057792 A1    Mar. 5, 2009

(30) Foreign Application Priority Data
Dec. 22, 2004 (EP) .................................... 04106835

(51) Int. Cl.
*H03H 9/70* (2006.01)
(52) U.S. Cl. ...................... 331/156; 331/36 C
(58) Field of Classification Search ............ 331/36 C, 331/154, 156
See application file for complete search history.

(56) References Cited

U.S. PATENT DOCUMENTS

| | | | |
|---|---|---|---|
| 6,262,464 B1 | 7/2001 | Chan et al. | |
| 6,600,252 B2 * | 7/2003 | Nguyen | 333/197 |
| 6,621,134 B1 | 9/2003 | Zurn | |
| 6,624,726 B2 * | 9/2003 | Niu et al. | 333/197 |
| 6,717,488 B2 | 4/2004 | Potter | |
| 7,796,710 B2 * | 9/2010 | Abe et al. | 375/329 |
| 2001/0033119 A1 | 10/2001 | Nguyen et al. | |
| 2002/0075098 A1 | 6/2002 | Khuri-Yakub et al. | |
| 2003/0052742 A1 | 3/2003 | Niu et al. | |
| 2004/0232501 A1 | 11/2004 | Bircumshaw et al. | |

FOREIGN PATENT DOCUMENTS

| CN | 1328955 A | 1/2002 |
|---|---|---|
| WO | 03023957 A1 | 3/2003 |

OTHER PUBLICATIONS

Ayazi, F; et al "High Aspect-Ratio Combined Poly and Single-Crystal Silicon (HARPSS) MEMS Technology" Journal of Microelectromechanical Systems, vol. 9, No. 3, Sep. 1, 2000, pp. 288-294.

Nguyen, C. T-C: "Vibrating RF MEMS for Next Generation Wireless Applications" Custom Integrated Circuits Conference, 2004. IEEE, Proceedings. Oct. 3, 2004, pp. 257-264.

(Continued)

*Primary Examiner* — James E Goodley

(57) ABSTRACT

A resonator has a vibrating element (10) and at least a first (20) and a second (30) electrode, at least one of the electrodes storing an electric charge to make the device charge biased. A charge adjuster (C) can add to or reduce the stored charge. The charge adjuster can be a capacitor to reduce leakage, and or a power supply coupled by switch. It can reduce problems of stiction, and reduce power consumption, and reduce non linearity's, it enables the charge level to be adjusted before operation. A second switch can be used to ground the vibrating element.

17 Claims, 6 Drawing Sheets

OTHER PUBLICATIONS

Bower, C. et al. "On-Chip Vacum Microtriode Using Carbon Nanotube Field Emitters," Applied Phys. Letters, vol. 80, issue 20, pp. 3820-3822 (May 20, 2002).

Iannaccone, G. et al. "Program, Erase and Retention Time of Thin-Oxide Flash-EEPROMs," Proc. 7th Int'l. Workshop on Computational Electronics, Glasgow, pp. 153-154 (2000).

Mattila, T. et al. "14 MHz Micromechanical Oscillator," Sensors and Actuators, A 97-98, pp. 497-502 (2002).

Kaajakari, V. et al. Square-Extensional Mode Single-Crystal Silicon Micromechanical Resonator for Low-Phase-Noise Oscillator Applications, IEEE Electron Device Letters, vol. 25, No. 4, pp. 173-175 (Apr. 2004).

Mattila, T. et al. "A 12 MHz Micromechanical Bulk Acoustic Mode Oscillator," Sensors and Actuators, A 101, pp. 1-9 (2002).

* cited by examiner

CHARGE BIASED MEM RESONATOR

This invention relates to MEM resonators and devices incorporating such resonators as well as methods of operating the same.

Microelectromechanical (MEM or MEMS) resonators are known and are notable for high on-chip Q-factors at RF frequencies. MEM resonators convert electrical signals into extremely low-loss mechanical vibration of a vibrating element, and convert the vibration back into electrical signals. They produce an output only if the input is close to the resonant frequency of the moveable element. They can be used as narrow band filters which can be incorporated into oscillators, or VCOs for example. Previously such functions often used components such as SAW filters or quarts resonators. Quartz resonators have been used as frequency selective elements in oscillator circuits (e.g. Colpitts Oscillator, Pierce Oscillator). Unfortunately quartz resonators are costly, bulky discrete components which cannot be integrated easily using fabrication techniques that are compatible with modern IC processes. Hence MEM resonators are of interest to reduce packaging/assembly cost and component count, reduce impedance matching issues, and parasitics that can significantly affect performance for RF applications. This can lead to consolidating all of the RF/analog/digital components onto a single wireless-enabled chip, commonly called RF system-on-a-chip (SoC). This can use modern CMOS processes for example, on N or P type monocrystalline semiconductor wafers. Various resonator geometries are known for the vibrating element and the electrodes, including vibrating elements in the form of clamped beams, cantilevers and discs, and arrangements with multiple vibrating elements.

It is known from US patent application 20030052742 to provide MEM resonators comprising at least two vibratable members that are closely spaced relative to a wavelength associated with their vibrating frequency, and driven to vibrate one-half a vibration period out of phase with each other, i.e. to mirror each others motion. Driving the vibratable members as stated leads to destructive interference effects that suppress leakage of acoustic energy from the vibratable members into the die, and improve the Q-factor of the resonator. Vibratable members in the form of vibratable plates are formed by deep anisotropic etching one or more trenches in the die, using a similar process to that used to form integrated capacitors for CMOS based memory.

It is known from WO 03/023957 that high Q mechanical resonators operated in the 100+ MHz range have some limitations. Additionally, the upper frequency range of these high Q resonators is low restricting their use for some applications. Further these high Q resonators are difficult to fabricate and have a relatively large mass. Accordingly this document suggests the resonator includes a member with an embedded charge, at least one input electrode, at least one output electrode, and at least one common electrode. The input and output electrodes are spaced from and on substantially opposing sides of the member from the common electrode. At least one of the member and the input and output electrodes is movable with respect to the other. During manufacture, electrons are injected into the member with an electron gun to deposit an embedded charge, although other techniques for storing embedded charge in the member can also be used, such as applying an electrical bias across the member sufficient to cause electron injection, ballistic injection, polarization, and high field injection. The same techniques can be used to store an embedded charge in a member formed of dielectric or formed as a charged floating conductor.

There remains a need for improved devices.

An object of the invention is to provide improved MEM resonators and devices incorporating such resonators as well as methods of making and operating the same.

According to a first aspect, the invention provides:

a resonator comprising a vibrating element and an electrode, arranged to cause the element to vibrate according to an input signal, and to generate an output signal according to the vibration, at least one of said electrode and the vibrating element being arranged to store an electric charge when in use, whereby at least one of said electrode and the vibrating element comprises a charge adjuster arranged to add to or reduce the stored charge.

The resonator can have input and output electrodes. Moreover the present invention does not require a common electrode.

The vibrating element can be a grounded conductor and the input electrode can be a floating charged conductor. It can be charged up at an appropriate time e.g. when it is precharged during manufacturing with a needle.

The above arrangements can help enable the amount of charge to be maintained against charge leakage. It can also enable the amount of charge to be reduced so that pull in forces to the substrate are reduced, thus reducing problems of stiction. Advantages of using stored charge rather than a voltage source to bias the device, can include reduced power consumption, less need for high voltage power supplies, and more linear output current with displacement of the vibrating element. Reducing such non-linear effects can lead to higher a Q factor and so narrower band filtering characteristics. This is particularly true under certain operation conditions, where the electrical non-linearity's dominate over the mechanical non-linearity's.

An additional feature of the present invention is the charge adjuster comprising a charge reservoir coupled to the charged electrode or charged element. This is a particularly straightforward way of maintaining charge against leakage. Since the reservoir can store much more charge than the electrode alone, a given leakage will have a proportionally much smaller effect on the amount of charge left on the combined reservoir and electrode.

Another additional feature is the charge adjuster comprising a voltage source coupled by a first switch to the charged electrode or charged element. This can be used with a charge reservoir or instead of it. In either case, it enables the charge level to be adjusted before operation.

Another such additional feature is the charged electrode or charged element being an input or output electrode. As opposed to having a common electrode or vibrating element being charged, this can bring some of the benefits of charged electrodes, being reduced power consumption, less need for high voltage power supplies, and more linear output current with displacement of the vibrating element, while reducing the drawbacks of pull in forces on the vibrating element if it is charged.

Another such additional feature is charged electrodes or charged elements being arranged on both sides of the vibrating element. This can improve linearity of the device characteristics. Electrodes on opposing sides is not necessarily an essential requirement for the invention.

Another such additional feature is the charge reservoir comprising a decoupling capacitor in an input or output path to or from an electrode.

Another additional feature for a dependent claim is the vibrating element being coupled to earth. This can enable the vibrating element to be used as an output electrode in a two electrode, one gap arrangement, or used with charged electrodes on one or both sides, for example.

Another additional feature for a dependent claim 1s the vibrating element being coupled to earth via a switch. This can enable any charge on the vibrating element to be reduced before operation or at any time. A further advantage of using switches is that they can have low leakage. Also, although an alternative without a switch is simpler, it can lead to some non linearity in output.

Another additional feature is the vibrating element being incorporated with the charged electrode or charged element. This can enable a two electrode device with one gap.

Another additional feature is a second charged electrode or element.

Another additional feature is the second charged electrode being charged to a different polarity. This can reduce the motional impedance of the vibrating element.

Another additional feature is a controller arranged to control the first and/or second switches to be closed to precharge the resonator and to be open during operation. Alternatively the controller can be arranged to control the first switch and/or second switch to be closed during operation, to enable the device to operate as a voltage biased device.

Another additional feature is the first and/or second switch comprising a MEM switch.

Other aspects of the invention include methods of operating the resonator, and an integrated circuit comprising the resonator.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present claims.

How the present invention may be put into effect will now be described by way of example with reference to the appended drawings, in which.

Figure 1:
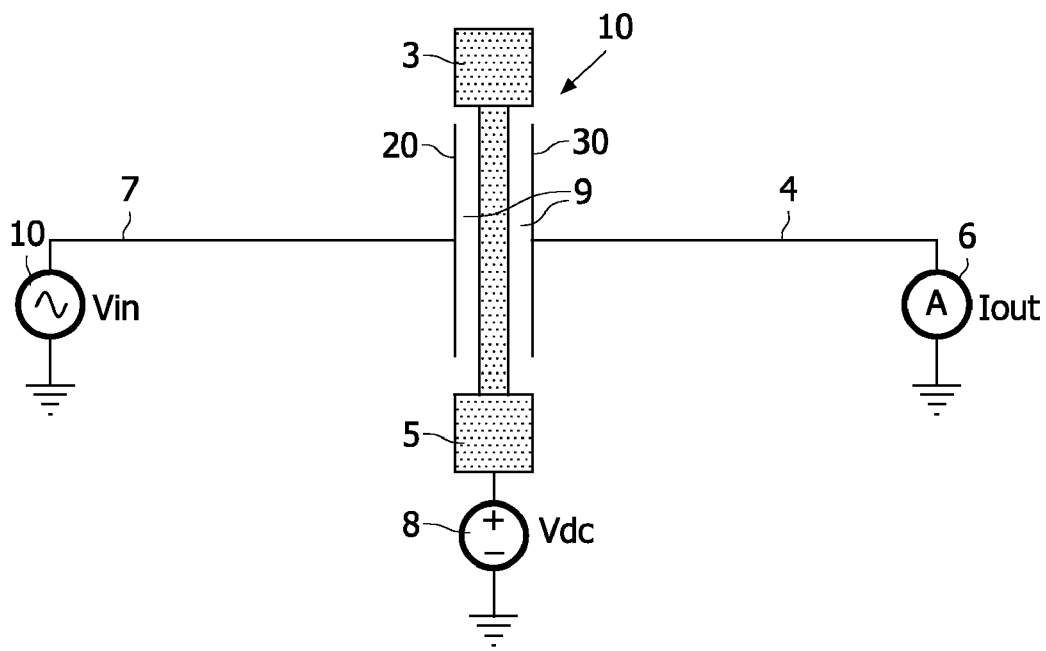
FIG. 1 shows a conventional resonator.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

FIG. 1 shows schematically a conventional voltage biased MEMS resonator. A vibrating element 10 is sandwiched between two electrodes 20, 30. The squares 3, 5 indicate the anchors by which the vibrating element is fixed, e.g. to a substrate. The resonator is attached to or is part of the substrate.

The resonator needs a high voltage supply 8 to bias the electrodes 20, 30 with a high DC voltage to achieve a high electric field in the gaps 9. An alternating voltage source Vin 10 is shown as an input 7, and an output 4 is measured in terms of a current Iout (6) induced by the vibrating element 10.

Figure 2:
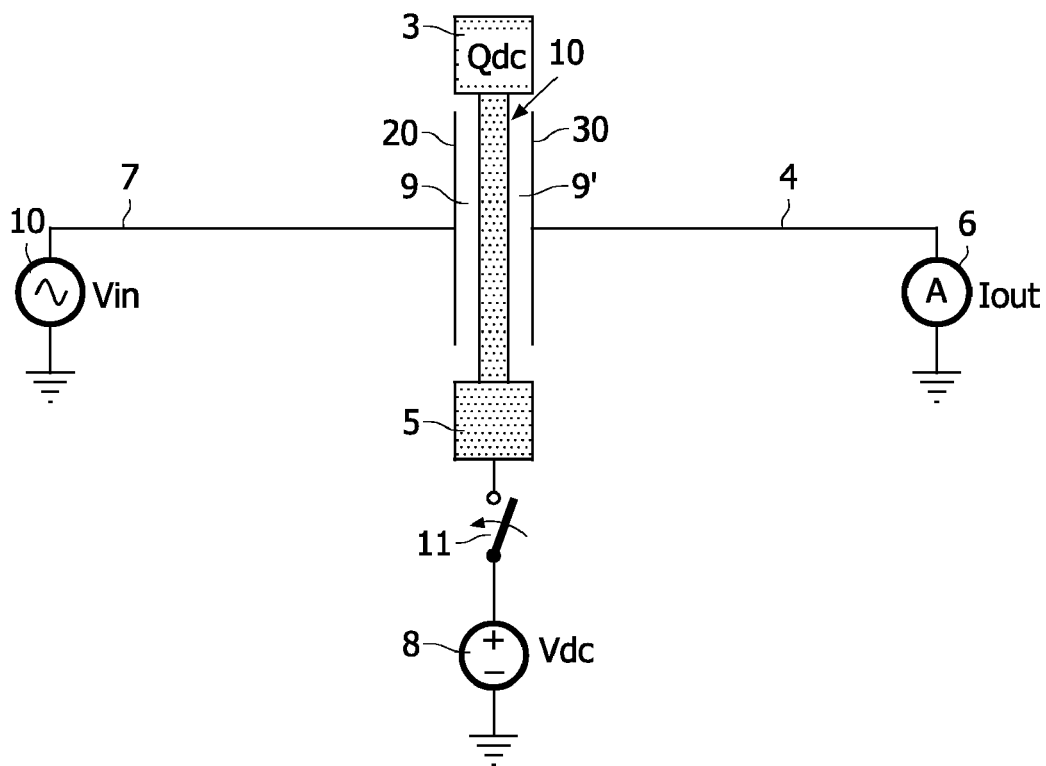
FIGS. 2 to 7 show resonators according to embodiments of the invention.

FIG. 2 shows schematically a first embodiment of a charge biased resonator in accordance with the present invention. The resonator is attached to or is part of a substrate, e.g. a semiconductor substrate. As described above, the squares 3, 5 indicate the anchors by which the resonating element is fixed, e.g. to the substrate. Clearly other geometries are conceivable for the vibrating element and its anchor or anchors, as discussed above, and it is not intended to limit the present invention to a particular geometry. Compared to FIG. 1, this arrangement differs in that biasing of the resonator is done with a fixed charge instead of a fixed voltage. Accordingly the beam 10 is not connected to a DC voltage supply during use. An advantage of this method is that the resonator does not need a separate high DC voltage source 8 and once biased, e.g. during production, the biasing, and therefore the frequency of the resonance is not susceptible to variations in level of the DC voltage supply during operation. This allows more accurate tuning of its resonance frequency.

If the same bias voltage is used the motional resistance of the charge biased resonator is at least approximately equal to a voltage biased resonator. The gap 9 between the resonator beam 10 and the left electrode is g+x, the gap 9' between the beam and the right electrode is g−x (x is the displacement from equilibrium). A charge $Qdc=Vdc\, 2\, A\, \epsilon_0/g$ is applied when the switch is closed. The ac voltage Vin=0 when applying the bias charge. In accordance with a further embodiment, whereas previously the stored charge was inserted only during manufacture, e.g. by an electron gun, now a charge adjuster is provided to add to or reduce the stored charge, in the form of a voltage supply 8 coupled by a switch 11. Since a switch 11 is provided, the pre-charging can be repeated. Before operation the resonator is pre-charged, e.g. the switch 11 is closed, Vin=0V. During operation the switch 11 is open. Ideally no charge leaks away, but in practice there will be some leakage. Accordingly, the switch 11 can be closed briefly to refresh the charge. This can be carried out in the field such as at switch on or initialization of a system, or less often, such as when maintenance is carried out, or when a fault is detected.

Figure 3:
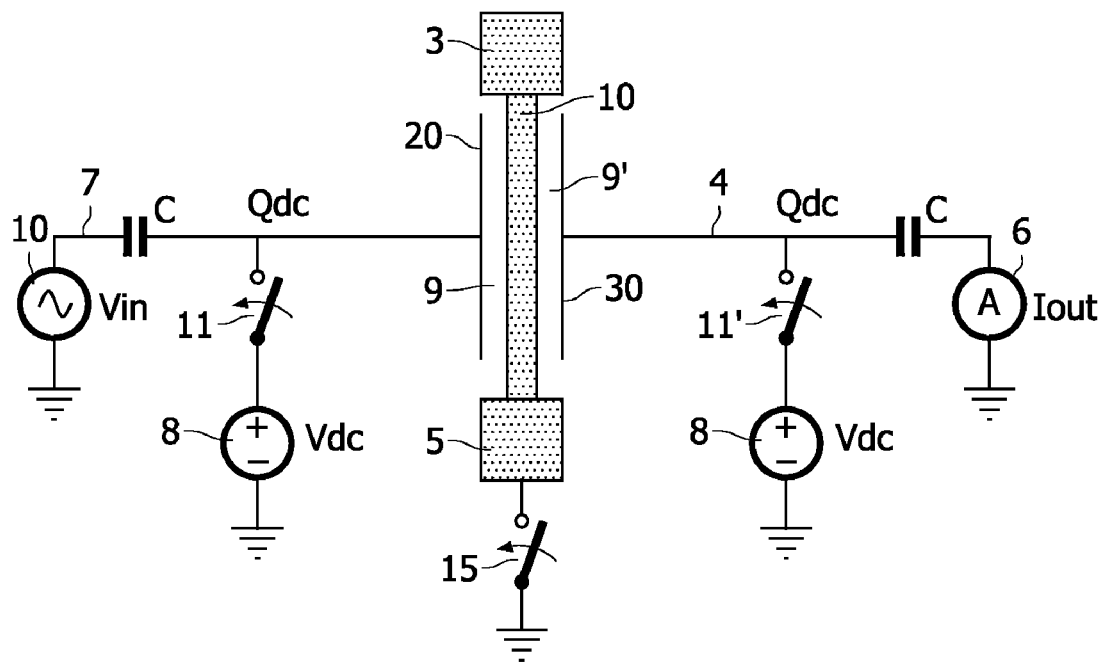

Charge-biasing the resonator by adding charge to the vibrating beam 10 as in FIG. 2 has one drawback. When much charge is accumulated on the free beam 10, a force might develop between the substrate and the free beam 10. This effect can lead to deformation and eventually even pull-down and stiction of the resonator. Accordingly, in other embodiments, the vibrating element 10 is held to ground potential. In the embodiment of FIG. 3, electrodes at either side of the element 10 are input 20 and output 30 electrodes respectively, and are both used to store a charge, to charge bias the resonator. A charge adjuster in the form of a voltage supply 8; 8' coupled by a first switch 11; 11'is provided for each electrode 20, 30 separately. A decoupling capacitor C is provided to keep the high charging voltage from spreading to other parts of the circuit, e.g. at both input and output. The decoupling capacitors C can each act as a charge reservoir, or other capacitors can be provided for this purpose.

The potential on the vibrating element 10 is kept low by a coupling to a substrate (assumed to be at ground potential) or to a ground electrode via a second switch 15. Before operation the resonator is pre-charged and all switches 8, 8'; 15 are closed. During operation all switches 8, 8'; 15 are open. It can be shown that the operation of the resonator in FIG. 3 is identical to that of FIG. 2, except for the effect of the two series decoupling capacitors C. In the limit that the capacitance of C is infinite, both charge biased resonators have the same motional impedance, the resonator in FIG. 3 however does not suffer from pull-in forces towards the substrate.

Another advantage of using a charge reservoir is that it can be used as a buffer to diminish the effect of small leakage currents. As the capacitors C can store much more charge than the resonator itself (which has a capacitance of only $A \epsilon_0/g$), the amount of charge stored by the decoupling capacitors can be made very much larger. Therefore leakage currents will have a much larger impact of the resonator of FIG. 1 or 2 than on that of FIG. 3.

A notable advantage of the arrangements of FIGS. 2 and 3 is the linear response of the electrical parts, although there may still be some non linearity's from mechanical causes. It can be shown that the charge biased resonator is more linear than a voltage biased device. Notably there are three sources of non linearity in a voltage biased case. The actuation force is proportional to a square of (Vdc+Vin). Secondly, the force is inversely proportional to a square of (g+x). Thirdly, the output current is not linear to the displacement. In contrast, for the charge biased device, Iout=$c(\omega)$*Vin, where c is independent of Vin. So only mechanical non-linearity's are left. Alternative implementations of the charge biased resonator with charge reservoir are also possible, however some of these do not have the same advantage of linearity. Examples are shown in FIGS. 4-7. Note that the resonators in FIGS. 4 and 6 only require one gap, which enables a simpler more compact construction.

Figure 4:
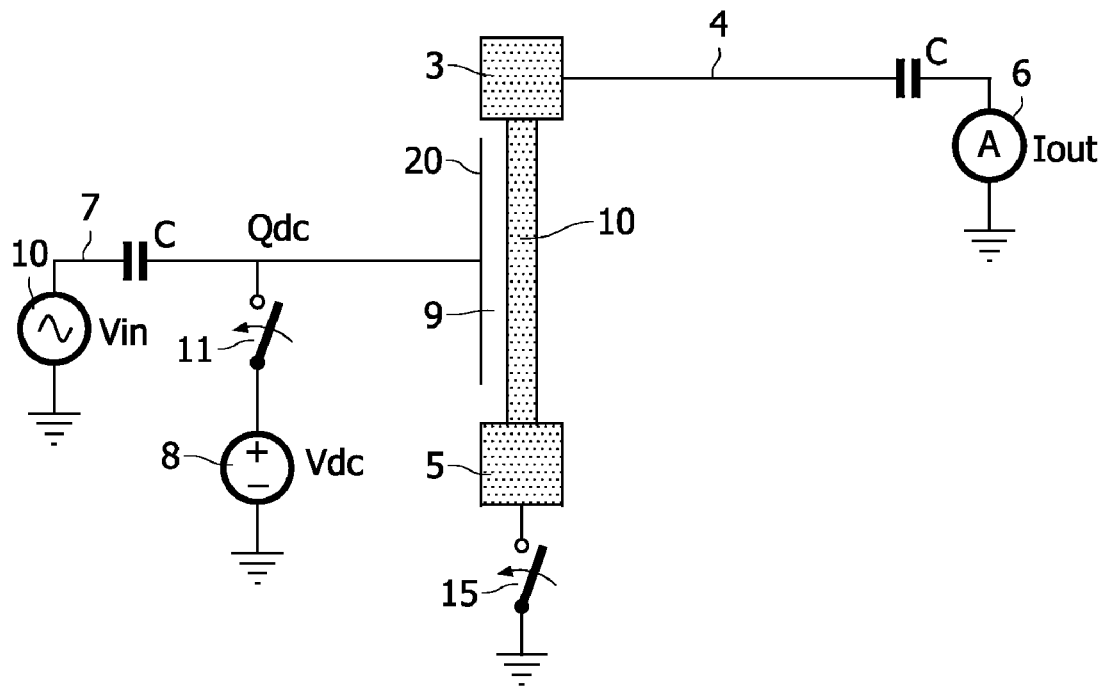

FIG. 4 shows a charge-biased resonator with one gap 9. Compared to FIG. 3, the output electrode 30 has been removed, and the vibrating element 10 is used as the output electrode. It is coupled to an output via a decoupling capacitor C. The potential of the vibrating element 10 is precharged to ground using a switch 15 as before.

Figure 5:
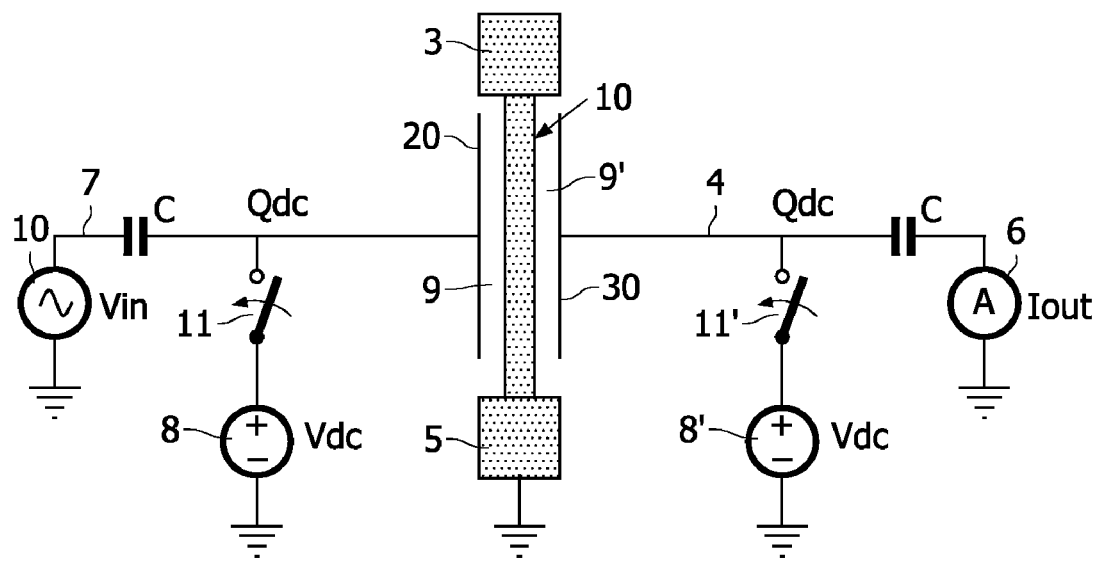

FIG. 5 shows a charge-biased resonator, with the vibrating element 10 fixed at ground potential without needing a second switch 15. Otherwise this is comparable to the embodiment of FIG. 3, but slightly simpler. Note that this configuration might show some non-linearity, e.g. in contrast to FIG. 3. Nevertheless, no DC voltage source is required after pre-charging it.

Figure 6:
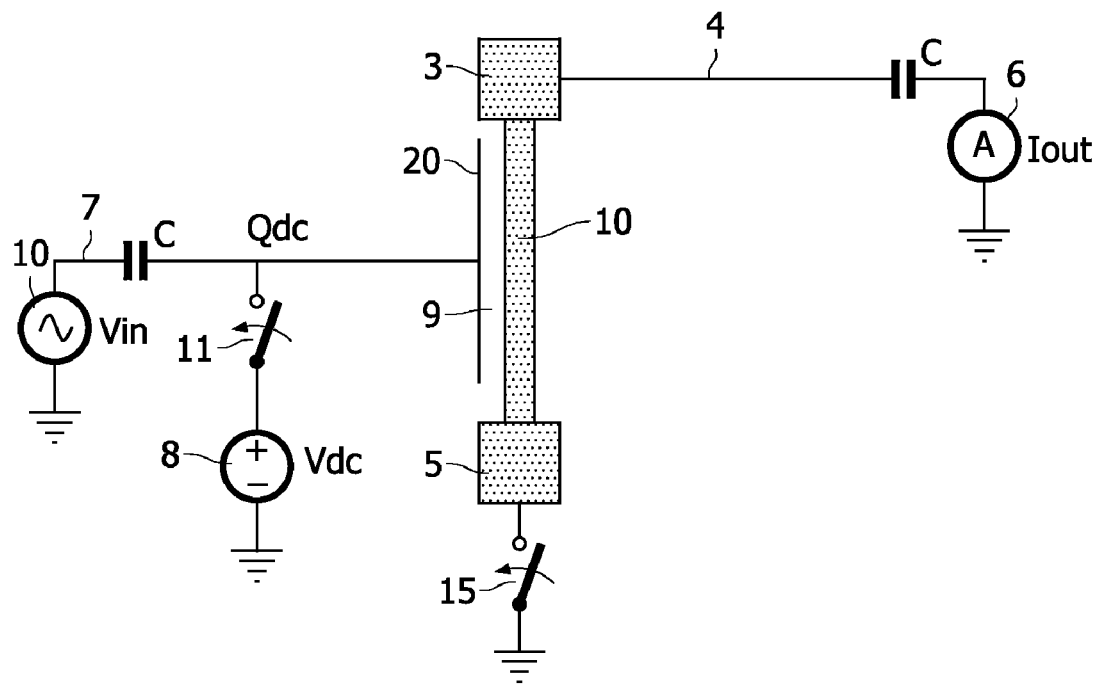

FIG. 6 shows an embodiment of a charge-biased resonator with one gap 9. This is similar to the embodiment of FIG. 4, but there is no second switch 15 to precharge the vibrating element 10 to ground. Hence there is also no need for a decoupling capacitor C on the output side.

Figure 7:
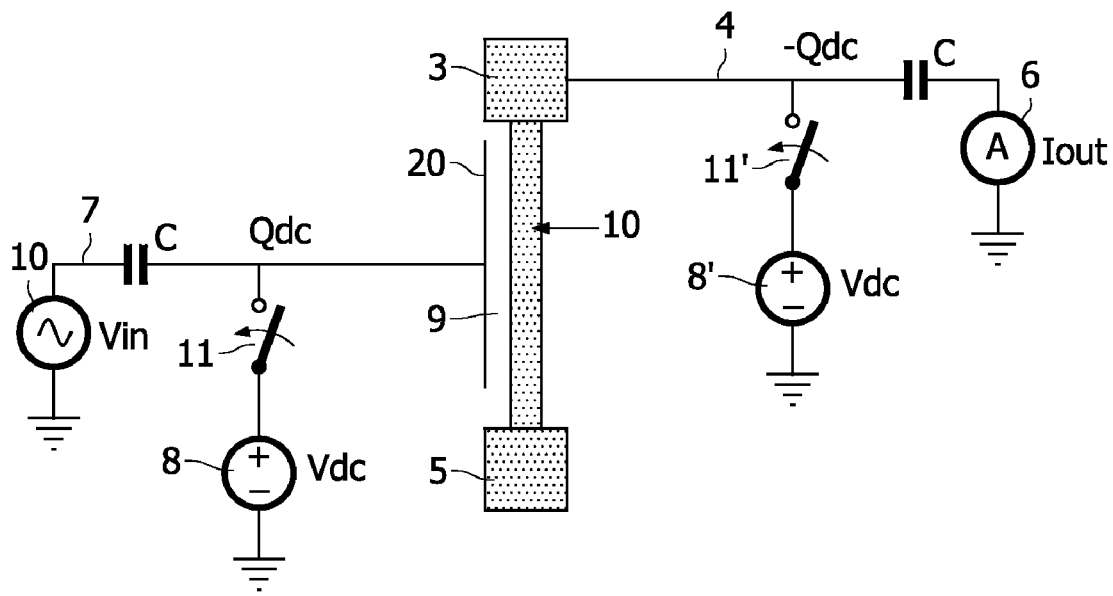

FIG. 7 shows an embodiment similar to that of FIG. 4, with one gap 9, but in this case the vibrating element 10, used as the output electrode, is precharged using a voltage source 8' coupled via a switch 11'. It is charged to an opposite polarity to the charging of the other electrode 20 on the other side of the gap 9 by a voltage source 8 and a switch 11. Also note that the motional impedance of the resonator in FIG. 7, is 4 times lower than that of the resonators in FIGS. 1-6 (which all have the same motional impedance if g>>x and Vdc>>Vin). Note that this reduction also occurs for a voltage biased resonator (all switches are closed). A disadvantage of the configuration in FIG. 7 is again that a pull in force might develop between substrate and resonator (the resonator is at elevated potential).

Figure 8:
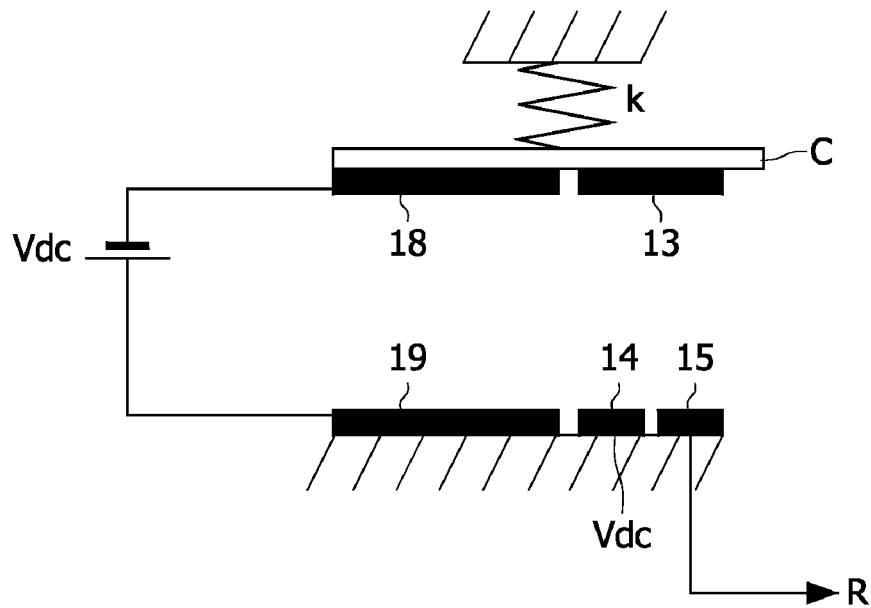
FIGS. 8 and 9 show an example of a MEM switch for use with the embodiments.
Figure 9:
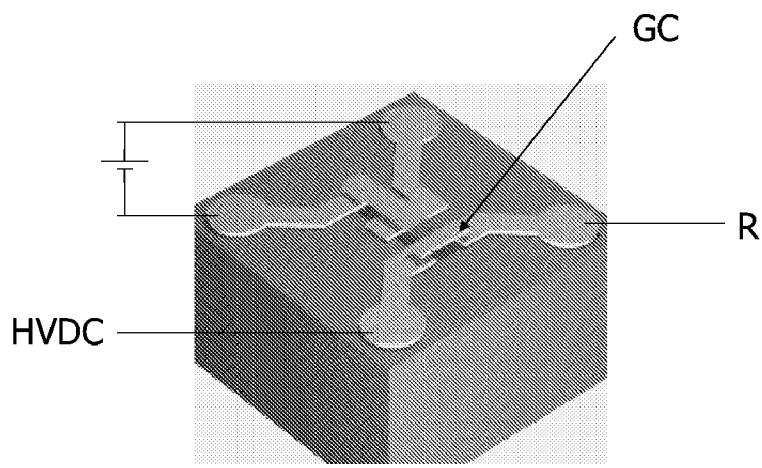

An alternative to using a switched voltage source to apply charge to a charge biased resonator is by doing this during production by applying the charge with a needle or probe on the resonator or into the charge reservoir. The needle can be removed and if the charge leakage is sufficiently low, the charge will stay in the reservoir. If charge leakage is too high an alternative implementation might be to use the switches which, once in a while connect the resonator or the reservoir to a voltage source to restore the charge. An example of a switch using MEM technology is shown in FIGS. 8 and 9. In FIG. 8 black areas are conducting electrodes. These Figures show two schematic views of a galvanic MEMS switch and how to connect it to the vibrating element or electrode of the resonator. FIG. 8 shows the switch has two driving electrodes 18, 19 which can be forced together by application of a drive voltage, to overcome a bias spring force k. This causes closure of a pair of switch contacts 13; 14, 15. One switch contact 14 can be coupled to a Vdc voltage supply, and the other switch contact 13 to the resonator or charging reservoir R, e.g. vibrating element or electrode, as desired, according to the arrangements described above. Electrodes 13, 18 are mounted on an insulating carrier C. When the switch closes an electrical connection is made between the charging voltage and the resonator/charge reservoir. FIG. 9 shows a three dimensional view of a possible construction of the switch in which GC is a galvanic contact, R is the resonator and HVDc is the high voltage connection for charging. Other geometries are possible. MEMS switches typically switch at voltages between 2-300 V, depending on the design. A typical value is 40 V. Because they have very low leakage currents they are very suitable to charge the resonator.

Figure 10:
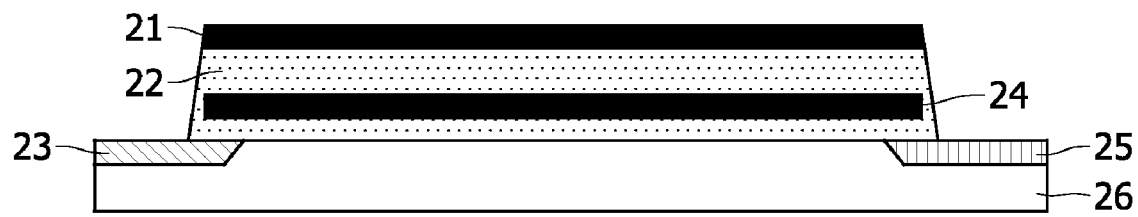
FIG. 10 shows an example of a floating gate device for use as a switch.

A transistor could be used, such as a normal FET or DMOS transistor for the switch, but for many applications the leakage currents are too high. Another example is a flash, OTP, or EPROM non-volatile memory transistor, connecting the resonator to the floating gate electrode. Electron injection can take place by CHEI (Channel Hot Electron Injection) or by Fowler Nordheim Tunneling (FN). FIG. 10 shows a schematic view of a typical non-volatile memory transistor. It has a substrate 27, a source 23, a drain 25, a dielectric layer 22, a floating gate 24 and a control gate 21. Charge can be injected in the floating gate 24 by applying the following voltages: typical values are: source=0V, drain=5V, Control gate=10V. Typical thickness of the dielectric between substrate and floating gate is 10 nm. Typical charge retention times of a floating gate can be very long. For example a 10 nm $SiO_2$ gate oxide with a potential of 4V can take $10^{20}$ ($10^{20}$) years before 10% of its charge leaked away (see G. Iannaccone and S. Gennai, Proc. 7th Int. Workshop on Computational Electronics, Glasgow 2000, p. 153, ISBN/ISSN 0-85261-704-6). For general information on non-volatile transistors see e.g.:

http://www-ee.eng.hawaii.edu/~msmith/ASICs/HTML/Book2/CH04/CH04.3.htm

Another possibility is a vacuum tube, e.g. a MEMS triode. For an example of a MEMS vacuum triode see Applied Physics Letters —May 20, 2002 —Volume 80, Issue 20, pp. 3820-3822. The resonator or the charge reservoir could be connected to the anode of the triode. Another possibility is to use a (MEMS) fuse, by applying the charge and melting the fuse afterwards. Note that with this method the charge cannot be refreshed later. Finally another alternative is to use a corona discharge, e.g. similar to the way in which electrets are charged.

Figure 12:
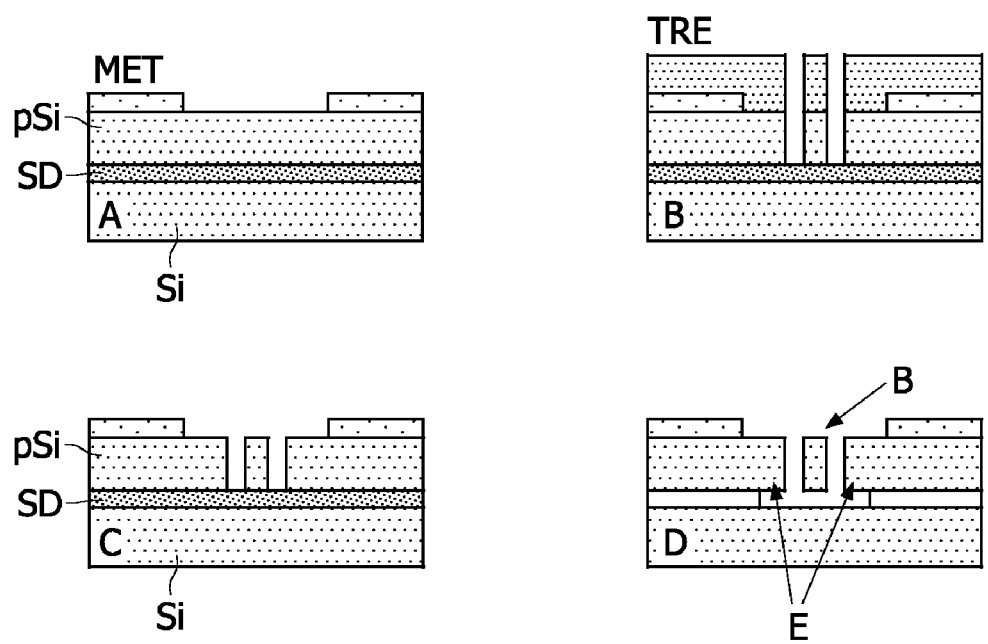
FIGS. 12A-D show an example of a method of manufacturing a resonator structure.

An example of a method of manufacturing a resonator structure is described briefly below with reference to FIG. 12.

In FIG. 12A an SOI wafer comprises a p-doped silicon layer (pSi) and insulating silicon dioxide layer (SD), a silicon substrate (Si) and an aluminum metal layer (MET) is sputter deposited onto the wafer. This layer can have a resistivity of 3 microohm.cm. The metal layer is patterned by conventional lithographic techniques. As shown in FIG. 12B a lithographic resist mask (TRE) is applied and patterned followed by etching of two or more deep trenches into the upper silicon layer until the $SiO_2$ layer is reached, e.g. as an etch stop. As shown in FIG. 12C the resist is removed. As shown in FIG. 12D the $SiO_2$ is selectively etched away, e.g. using buffered oxide etchant (BOE), via access through the trenches. This leaves the resonator beam anchored to the silicon and suspended between two edges faces of silicon semiconductor which can act as the electrodes.

Figure 11:
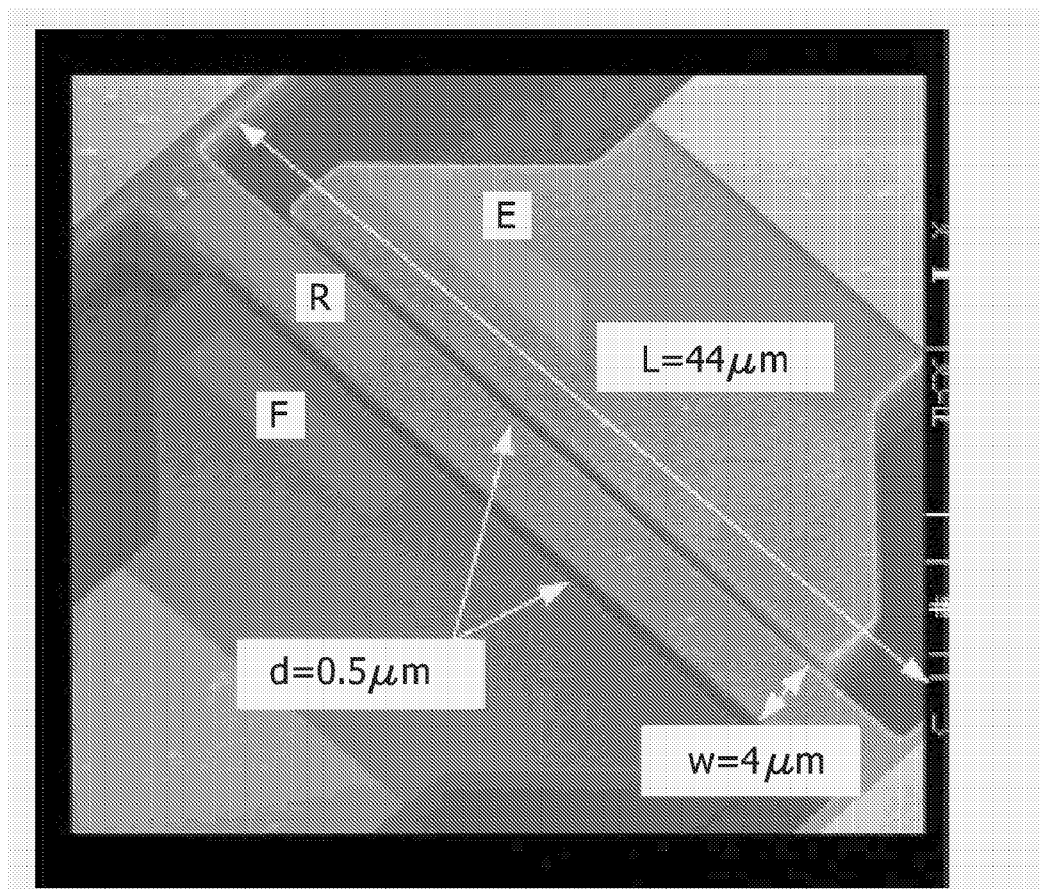
FIG. 11 shows an example of a resonator structure for use in the embodiments.

Implementation examples of the resonator structure can use conventional MEMS resonator structures, an example is illustrated in FIG. 11 which shows an SEM picture from "Sensors and Actuators", A 97-98 (2002), pp. 497-502. This shows a vibrating element in the form of a beam resonator R, and anchored at each end. Electrodes E, F are shown on either side. The anchor supports and outer parts of the electrodes are metallized in this example. The dimensions make it suitable for operation at around 14 Mhz. Note that to operate the devices as charge biased resonator, they need to be connected in different ways as illustrated above for example. For implementations examples of a one gap resonator see the resonators in IEEE ELECTRON DEVICE LETTERS, VOL. 25, NO. 4, APRIL 2004, p. 173 and "Sensors and Actuators", A 101 (2002), pp. 1-9. In a typical implementation example, using a 30V charge voltage, without special precautions to prevent leakage, the charge is likely to remain on the resonator for many hours. The vibrating element can be conducting or the vibrating element can be an isolator. When the vibrating element is a charged isolator one can refer to having an electret (as used in microphones).

If measures are taken such that charge does not leak away, one can completely leave out the chargepump/dc-dc-converter (for generating the very high voltage), and the circuit becomes very simple/cheap. Charge could for example be applied to the vibrating element during manufacturing (using electron guns/probe needles/etc). This is one embodiment of the invention. If charge does leak away, there is the situation where the chargepump/dc-dc converter only needs to be active once in a while, which is also advantageous because of a power saving. This is another embodiment of the invention. Additional charge reservoir capacitors are possible at various places. As discussed above, when charge leaks away from the vibrating element or from the electrodes, charge from these capacitors will fill up (and thus compensate) for the leaked charge. Basically there are three main options: 1) Extra capacitor coupled to electrodes 2) Extra capacitor coupled to the vibrating element 3) Extra capacitors coupled to electrodes and to the vibrating element.

Charge leakage can be prevented/reduced by packaging the resonator in a vacuum package. This has the advantage of allowing a sufficiently high Q-factor.

Applications and uses of these MEMS resonator include oscillators (for frequency reference signals) or filters in integrated circuits, including any applications of SAW/BAW filters.

To summarize, one of the main advantages of the charge biased resonator is the fact that no DC voltage source is required during operation. The resonator thus only needs to be pre-charged before operation. If charge-leakage can be prevented it thus only needs to be pre-charged once during production allowing the resonance frequency to be tuned to the right value at the same time. The absence of a DC voltage source also implies that the energy consumption of the resonator becomes zero. The charge biased resonator can therefore be considered as a purely passive device (like a quartz crystal).

Charge biasing has an other advantage, namely that the resonator becomes linear in all events, even if the conditions Vdc>>Vin and g>>x are not satisfied. Electrical non-linearity's are therefore excluded and only mechanical non-linearity's remain. This can simplify design or increase Q value. Notably it is clear that the biasing does not necessarily have to be performed on the vibrating element itself but can be applied to electrodes using an external charge reservoir. Some advantages are:

No force between substrate (at GND potential) and resonator, thus reduced risk of stiction.

Charge reservoirs act as a charge buffer which strongly reduces the effect of leakage currents on the resonator operation and can thus strongly increase the functional lifetime of the resonator.

Possibly simpler implementation of a leakage free device.

Some of the implementations can also be operated as voltage biased resonators (by keeping all switches closed).

The invention claimed is:

1. A resonator comprising:
a vibrating element; and
an electrode, arranged to cause the vibrating element to vibrate according to an input signal, and to generate an output signal according to the vibration, at least one of said electrode and the vibrating element being arranged to store an electric charge when in use, wherein at least one of said electrode and the vibrating element comprises a charge adjuster arranged, during operation of the resonator, to add to or reduce the stored charge, the charge adjuster including a voltage source coupled by a first switch to one of the electrode, when charged, and the vibrating element, when charged.

2. The resonator of claim 1, the charge adjuster comprising a charge reservoir coupled to the charged electrode or charged element.

3. The resonator of claim 1, the charged electrode or charged element being an input or output electrode.

4. The resonator of claim 2, the charge reservoir comprising a decoupling capacitor in an input or output path to or from an electrode.

5. The resonator of claim 1, the vibrating element being electrically coupled to a substrate or to a ground electrode.

6. The resonator of claim 5, the vibrating element being electrically coupled to a substrate or ground via a second switch.

7. The resonator of claim 1, the vibrating element being incorporated with the charged electrode or charged element.

8. The resonator of claim 1, further comprising:
a second charged electrode.

9. The resonator of claim 1, having charged electrodes arranged on both sides of the vibrating element.

10. The resonator of claim 8, the second charged electrode being charged to a different polarity.

11. The resonator of claim 1, further comprising:
a controller arranged to control the first switch to be closed to precharge the resonator and to be open during operation.

12. The resonator of claim 6, further comprising:
a controller arranged to control the second switch to be closed to precharge the resonator and to be open during operation.

13. The resonator of claim 12, having the controller arranged to control the second switch to be closed during operation.

14. The resonator of claim 1, the first switch comprising a MEM switch.

15. The resonator of claim 6, the second switch comprising a MEM switch.

16. An integrated circuit comprising the resonator of claim 1.

17. The resonator of claim 11, having the controller arranged to control the first switch to be closed during operation.

* * * * *